United States Patent [19]

Gochermann

[11] 4,147,560
[45] Apr. 3, 1979

[54] SOLAR CELL ARRANGEMENT FOR TERRESTRIAL USE

[75] Inventor: Hans Gochermann, Holm, Fed. Rep. of Germany

[73] Assignee: Licentia Patent-Verwaltungs-G.m.b.H., Frankfurt, Fed. Rep. of Germany

[21] Appl. No.: 883,850

[22] Filed: Mar. 6, 1978

[30] Foreign Application Priority Data

Mar. 5, 1977 [DE] Fed. Rep. of Germany ....... 2445642

[51] Int. Cl.² ............................................. H01L 31/04
[52] U.S. Cl. ................................................. 136/89 H
[58] Field of Search ............................ 136/89 H, 89 P

[56] References Cited

U.S. PATENT DOCUMENTS

| 3,778,684 | 12/1973 | Fischer et al ..................... 317/234 R |
| 4,001,863 | 1/1977 | Kobayashi et al. .................... 357/30 |
| 4,009,054 | 2/1977 | Gochermann et al. ............. 136/89 P |
| 4,067,764 | 1/1978 | Walker et al. ........................ 156/267 |

*Primary Examiner*—Aaron Weisstuch
*Attorney, Agent, or Firm*—Spencer & Kaye

[57] ABSTRACT

A solar cell generator for producing electrical energy for terrestrial use including a plurality of interconnected solar cells encased on all sides by a radiation resistant plastic material and a foil of a weather resistant material which adheres to the plastic material covering the outer surfaces of the casing.

5 Claims, 2 Drawing Figures

SOLAR CELL ARRANGEMENT FOR TERRESTRIAL USE

BACKGROUND OF THE INVENTION

The present invention relates to a solar cell arrangement for producing electrical energy for terrestrial use in which the solar cells are encased on all sides by a radiation resistant plastic material.

In solar cell arrangements as disclosed, for example, in U.S. Pat. No. 4,009,054 issued Feb. 22, 1977, the subject matter of which is incorporated by reference, a plurality of interconnected solar cells are encased in a glass fiber reinforced plastic material. In such arrangements, it may happen that parts of the glass fiber fabric are exposed on the surface of the housing or casing. These parts of the glass fiber fabric are thus exposed to the atmosphere and may rot in the course of time. This in part causes a decrease in the mechanical and optical properties of the casing with the result that the energy yield of the solar cell generator is reduced. In order to overcome this drawback and protect the surface of the casing, a layer rich in a resin material is applied to the outer surface of the glass fiber reinforced plastic as a so-called fine coating or gel coat. These previously employed fine coatings, however, are sometimes sensitive to erosion or abrasion and are subject, albeit conditionally, to aging.

In the prior art, such fine coatings have been produced by applying a synthetic material to foils and then hardening the synthetic material whereupon such foils are applied to the surface of the glass fiber reinforced plastic as coatings.

The cross-sectional view of FIG. 1 shows the structure of an embedded solar cell arrangement according to the prior art manufacturing methods. The interconnected solar cells 1 are embedded directly on all sides in a casing of glass fiber reinforced plastic material 2. In order to obtain a smooth and self-cleaning surface, a fine coating 3 which is rich in resin, is provided so as to enclose the glass fiber reinforced casing on all sides. Reference numeral 5 is a lead for connecting the two solar cells 1 in series.

SUMMARY OF THE INVENTION

It is therefore the object of the present invention to provide a solar cell arrangement for terrestrial use which is easier, i.e., more economical, to manufacture and whose thickness can be further reduced.

This is accomplished according to the invention in that in a solar cell generator for producing electrical energy for terrestrial use including a plurality of interconnected solar cells encased on all sides in a casing of a radiation resistant plastic material, the outer surfaces of the plastic casing are covered with a foil of a weather resistant material which adheres to the plastic material. A suitable foil according to the invention is made of a polyvinyl fluoride plastic as it is sold by Du Pont Company under the trademark "Tedlar". A foil of polyvinylidene fluoride can also be used for this purpose.

In a solar cell arrangement with foils according to the present invention, the surfaces are more resistant to weather influences and mechanical damage and they are easier to clean. The arrangements as a whole become thinner, which is an advantage from a thermomechanical point of view, since fewer mechanical stresses are induced by changes in temperature as a result of different coefficients of thermal expansion of the solar cell and the plastic. Finally, the foils for the surfaces of terrestrial generators can be applied more easily and thus more economically.

DETAILED DESCRIPTION OF THE PREFERRED EMBODIMENTS

Figure 1:
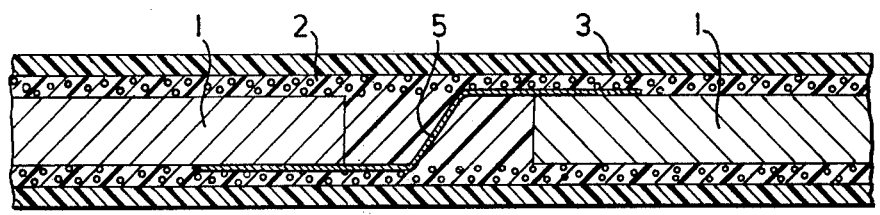
FIG. 1 is a cross-sectional view of a portion of a solar cell generator according to the prior art.
Figure 2:
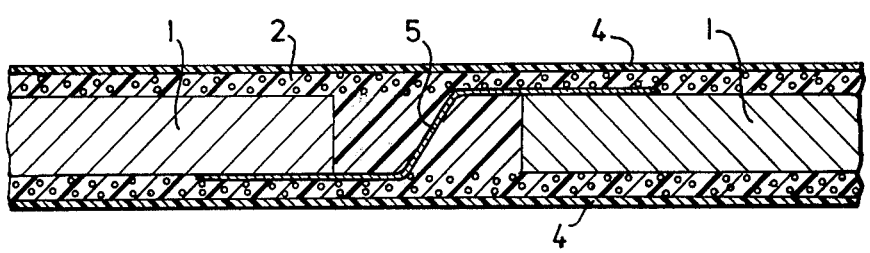
FIG. 2 is a cross-sectional view of a portion of a solar cell generator according to the invention.

FIG. 2 shows a solar cell arrangement or generator according to the present invention. The solar cells 1 are interconnected via lead 5 and are again embedded on all sides in a casing of a glass fiber reinforced plastic material 2. However, instead of the resin-rich fine coating 3 applied by means of intermediate foils as shown in FIG. 1, according to the invention only a foil 4 is applied to the outer surfaces of the layers 2 as a protection against weather and mechanical influences. The foils 4 are formed of a weather resistant material which adheres to the plastic material of the casing. Preferably, as mentioned above, the foils 4 are formed of polyvinyl fluoride or polyvinylidene fluoride. Foils formed of these materials are very weather resistant and with the appropriate pretreatment, will produce sufficient adhesion on the plastic layers 2. The surfaces of the solar cell generator provided according to the invention are less sensitive to mechanical abrasion and have a greater self-cleaning effect than the surfaces according to the prior art. Since the solar cell generators convert light into electrical energy, the foils 4 must be sufficiently transparent and must not be degraded during long periods of exposure to weather, particularly exposure to UV radiation, which is assured when the above-mentioned materials are employed for the foils 4.

Under certain circumstances, other polymerization products could also be used as covering foils for solar cell generators. An example of such another polymerization product is the substance from the group of the polytetrafluoro ethylenes which is known under the trademark "Teflon". A prerequisite for the use of this product is, however, that it has sufficient transparency.

To produce a solar cell generator according to this invention the following sequence of steps is necessary:

Upon one surface of the interconnected solar cell matrix, glass fiber layers are applied and impregnated with the plastic resin. Thereafter the covering foil is rolled on to the laminate. This assembly is turned over, further glass fiber layers are placed onto the other surface of the solar cells, these further glass fiber layers are impregnated with the plastic resin and then a second covering foil is rolled on to this side of the laminate. The last step is the hardening of the resin. One specific material used as the resin for the plastic layer is methylmethacrylate, known under the trademark "Plexit", manufactured by Roehm AG., Darmstadt, Western Germany. Another material is a polyester resin, the trademark "Balatal", manufactured by BASF, Ludwigshafen, Western Germany.

The material used for the foils 4 is polyvinylfluoride, known under the trademark "Tedlar" by the Du Pont Company. The pretreatment of the foil to provide adhesion to the resin is performed by the Du Pont Company noted which sells such pretreated films as standard items. Another material for the foil is made of borosilicate glass, manufactured by Schott Gen., Mainz, Western Germany.

The typical thicknesses of the various layers in the prior art arrangement according to FIG. 1 are as follows:

Solar cell (1):0.4 mm
glass reinforced material (2):0.3 mm
gel coat (3):0.4 mm

This results in a total thickness of about 1.8 mm.

The corresponding data for the present invention according to FIG. 2 are:

Solar cell (1):0.4 mm
glass reinforced (2):0.3 mm layer
foil (4):0.1 mm

This leads to a total thickness of about 1.2 mm.

One of the advantages of the invention is the reduction of the total thickness of the solar generators which results in lower cost of material and in the reduction of thermol-mechanical stresses between the solar cells and the embedding material.

Furthermore the fabrication process is more economical by the use of a foil instead of the manufacturing of a gel coat layer as in the prior art.

The lifetime under use-conditions is higher because the surface is not so sensitive against erosion and abrasion. Another advantage is less humidity-permeability.

It will be understood that the above description of the present invention is susceptible to various modifications, changes and adaptations, and the same are intended to be comprehended within the meaning and range of equivalents of the appended claims.

What is claimed is:

1. In a solar cell generator for producing electrical energy for terrestrial use including a plurality of interconnected solar cells encased on all sides by a transparent radiation resistant plastic material, the improvement wherein the outer surfaces of the plastic casing are covered by a transparent foil of a weather resistant material which adheres to said plastic material.

2. A solar cell generator as defined in claim 1 wherein said foil is a polyvinyl fluoride or a polyvinylidene fluoride material.

3. A solar cell generator as defined in claim 1 wherein said radiation resistant plastic material is reinforced with a glass fiber fabric.

4. A solar cell generator as defined in claim 1, wherein said material of said foil is polyvinyl fluoride or polyvinylidene fluoride and wherein said radiation resistant plastic material is reinforced with a glass fiber fabric.

5. A solar cell generator as defined in claim 1 which said foil has a thickness of about 0.1 mm.

* * * * *

UNITED STATES PATENT AND TRADEMARK OFFICE
CERTIFICATE OF CORRECTION

PATENT NO. : 4,147,560

DATED : April 3, 1979

INVENTOR(S) : Hans Gochermann

It is certified that error appears in the above-identified patent and that said Letters Patent are hereby corrected as shown below:

In the heading of the patent, under [30] Foreign Application Priority Data, change "2445642" to --2709741--.

Column 2, line 51, after "is" insert --then--; line 60, after "resin," insert --sold under--; line 67, delete "noted".

Column 3, line 19, change "thermol-mechanical" to --thermo-mechanical--.

Signed and Sealed this

Twenty-third Day of October 1979

[SEAL]

Attest:

RUTH C. MASON
*Attesting Officer*

LUTRELLE F. PARKER
*Acting Commissioner of Patents and Trademarks*